STRUCTURE AND METHOD FOR PRODUCTION OF NARROW DOPED REGION SEMICONDUCTOR DEVICES

Filed Feb. 19, 1965

INVENTOR.
EUGENE TATOM
BY Shenier & O'Connor
ATTORNEYS

United States Patent Office 3,456,168
Patented July 15, 1969

3,456,168

STRUCTURE AND METHOD FOR PRODUCTION OF NARROW DOPED REGION SEMICONDUCTOR DEVICES

Eugene Tatom, Fairfield, Conn., assignor to United Aircraft Corporation, East Hartford, Conn., a corporation of Delaware Filed Feb. 19, 1965, Ser. No. 433,973
Int. Cl. H01l *11/14, 15/00;* B01j *17/00*
U.S. Cl. 317—235 2 Claims My invention relates to the manufacture of semiconductor devices, and more particularly to an improved method of forming very narrow channels at the surface of semiconductor wafers by the diffusion process.

Manufacturers commonly make high frequency transistors and other semiconductor devices, such as integrated circuits, by processes which include the step of diffusing one or more impurities into a semiconductor block or substrate. This diffusion step usually consists in heating the semiconductor block in the presence of an appropriate impurity material or dopant. The atoms of this dopant diffuse through the surface of the host block or chip and permeate it. The time of exposure and the temperature of the materials determine the depth of penetration of the dopant atoms into the semiconductor substrate. Since diffusion rates are slow the control of the time the semiconductor is exposed to the impurity provides a convenient and precise method of forming a diffused junction at a predetermined depth below the substrate surface.

Masking is one way to confine these dopants to predetermined areas in the semiconductor block. The mask usually comprises a passivating oxide layer that covers the surface of the semiconductor block except where diffusion is desired. An oxide coating is first formed over the entire surface of the semiconductor block by oxidation of its material, and openings are made in the coating by photoengraving techniques or other suitable methods known in the art.

Some semiconductor devices have regions of like conductivity type separated by a narrow moat or channel of material of the opposite conductivity type. The metal oxide field effect transistor is an example of such a semiconductor device. If the desired performance of such a device is to be achieved the channel must be extremely narrow such as of the order of a few microns in width.

In an attempt to make such a device in the prior art dopant has been diffused simultaneously though two mask openings separated by a narrow strip of masking oxide. This technique has proved unsatisfactory for production of very narrow channels since microscopic raggedness of the edge of openings or misalignment of the openings or both produces a diffused junction that intrudes into the desired narrow channel creating low voltage breakdown points or outright short circuits or both. The required definition and preciseness has been impossible with known techniques and has resulted in an undesirable limitation of the minimum practical channel width which could heretofore be successfully manufactured.

Another method of forming narrow channels in semiconductor devices is to construct the device in a thin epitaxial layer of doped semiconductor material. With this construction, the channel can be formed by a single diffusion through a single mask opening. But as the dopant diffuses from the surface through an engraved pattern in the mask, it diffuses laterally in the epitaxial layer as well as perpendicularly to its surface. This lateral diffusion in silicon, for instance, is approximately eight-tenths of the depth of diffusion in the crystal orientation generally employed. Thus the narrowest surface channel which can be made with this technique is limited by the thickness of the epitaxial layer. To make extremely narrow channels extremely thin epitaxial layers are required. But as the epitaxial layer gets thinner, its resistance increases so that semiconductor devices with a narrow channel made by this technique would not be practical for many applications.

I have invented a method of making a semiconductor device having regions of material of one conductivity type separated by an extremely thin channel of material of the opposite conductivity type.

One object of my invention is to provide a method of making narrower channels in a semiconductor substrate than is practical with techniques of the prior art.

An additional object of my invention is to provide a method of forming narrow channels in a semiconductor substrate which does not require precise masking, and which minimizes the consequences of flaws in the edge of the mask opening.

A further object of my invention is to provide a method of making narrow channels in a semiconductor substrate which are narrowest at the surface of the substrate.

One more object of my invention is to provide a method of making narrow channels in a semiconductor substrate that has a low resistivity.

A still further object of my invention is to provide a high frequency, high gain, metal oxide field effect transistor.

Yet another object of my invention is to provide a bipolar, variable-gain transistor.

Still another object of my invention is to provide a planar transistor with a high avalanche breakdown voltage, a low overall impedance and a low gate-to-drain leakage current.

Other and further objects of my invention will appear from the following description.

In general my invention contemplates the provision of a method of making a semiconductor device in which I control the time of diffusion of successive dopants of one conductivity type and of the opposite conductivity type into a substrate of the opposite conductivity type through a single mask opening until the junction formed by the second diffusion closely approaches that formed by the first diffusion to provide an extremely narrow region of material of one conductivity type between the regions of the opposite conductivity type. The channel thus formed is narrower at the surface than anywhere else, and its width can be smaller than the edge irregularities in the opening because there irregularities affect both junctions the same.

In the accompanying drawings which form part of the instant specification and which are to be read in conjunction therewith and in which like reference numerals are used to indicate like parts in the various views.

Figures 1, 2, 3, 4, 5, 6, 7, 8, 9, 10, 11, 12, 13, 14:
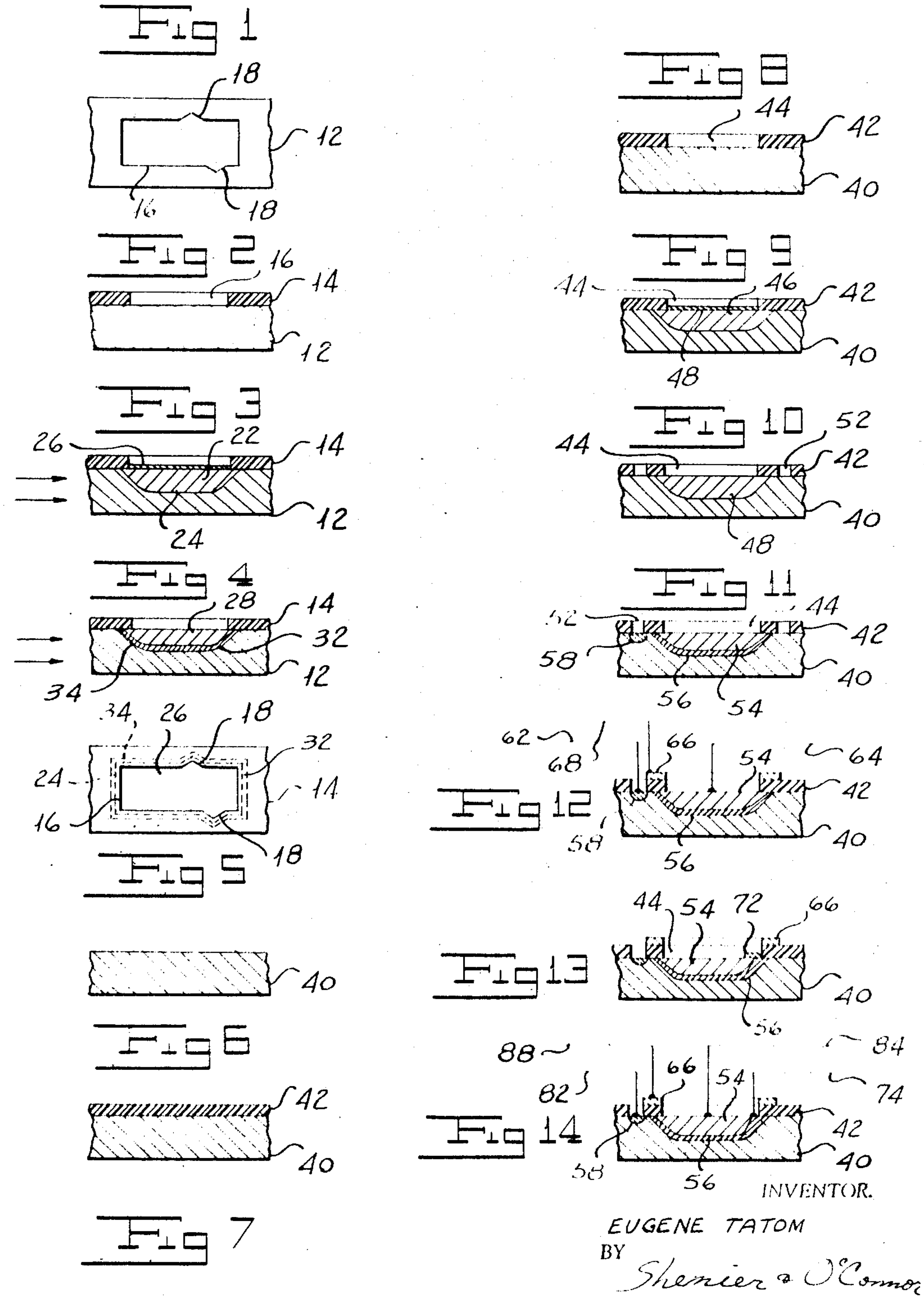
FIGURE 1 is a plan view of a piece of semiconductor material.
FIGURES 2, 3, 4 and 5 are respective sectional views of the semiconductor material shown in FIGURE 1 after successive diffusions have been performed in accordance with my invention.
FIGURES 6 through 12 are respective sectional views of a piece of semiconductor material showing the junctions formed by the successive steps in the manufacture of a metal-oxide field-effect transistor.
FIGURES 13 and 14 show the modification of the steps shown in FIGURES 6 to 12 to make a variable-gain, bipolar transistor.

More particularly, in FIGURES 1 to 5 I show a substrate of semiconductor material 12 with a masking coating 14 on its surface. The semiconductor 12 may be n-type silicon, for example, and the coating 14 could then conveniently be formed of silicon dioxide. There are a number of techniques known in the art for forming a masking coating 14. One commonly used method is to expose the surface of the silicon wafer 12 to moisture and air.

I make an opening 16 in mask 14 to expose an area of the semiconductor substrate surface either by photoengraving techniques or any other suitable method known in the art. I have shown an irregularity in the boundary of the masking coating 14 at 18. Irregularity 18 represents the microscopic irregularities which are invariably formed at the boundary of a mask opening irrespective of the method used to make the opening. The size of irregularity 18 is shown exaggerated for the purpose of illustration.

Next I diffuse a first dopant 22 through the mask opening 16. For example, to form a channel of p-type conductivity in an n-type silicon wafer 12 I would use a p-type dopant such as boron, aluminum, gallium, indium or thallium, for this first diffusion. There are many methods known in the art to cause the dopant 22 to diffuse into the wafer 12. One that I find is satisfactory is heating the wafer 12 and the impurity element 22 in the same vapor-tight enclosure. At a point below, but near, the melting point of the semiconductor material the dopant diffuses into the wafer 12 forming a hemispherical junction 24 at its boundary. The rate at which the impurity 22 diffuses into a semiconductor wafer 12 depends upon the impurity, the semiconductor and the diffusion process used. Diffusion can be a slow process. For example, using phosphorus as a dopant a period of 15 hours is required to produce a diffused layer 15 microns deep in 6 ohm-cm. p-type silicon heated to 1150° C. Once the diffusion rate is established for a particular combination of process and materials the junction 24 can conveniently and accurately be formed at a predetermined location by removing the semiconductor wafer from the dopant atmosphere after a predetermined period of time.

The dopant 22 not only diffuses downwardly into the wafer 12 at a fixed rate, but also diffuses laterally from the edge of the opening 16 at a fixed rate. Like the diffusion in depth, the lateral diffusion rate depends upon the dopant, the semiconductor wafer into which the dopant is diffused and the process conditions used. The rate of lateral diffusion is a fraction of the rate of diffusion perpendicular to the surface of the semiconductor substrate. Thus, I can control the lateral extent of lateral diffusion in the same manner as I do the diffusion perpendicular to the surface.

As is common in the art, advantageously, I diffuse the dopant 22 in an oxidizing atmosphere, to cause an oxide layer 26 to form on the exposed surface area following diffusion.

I preserve the boundary configuration of coating 14 around opening 16 so that I can diffuse a second dopant 28 through exactly the same opening 16 or through an opening which has at least the same boundary configuration as opening 16. The second dopant is of the opposite conductivity type to the first dopant, so in this example it is n-type.

Before performing the second diffusion I remove the relatively thin oxide layer 26 by any suitable method which preserves the configuration of the boundary of opening 16. A procedure I find satisfactory for this purpose is placing the surface of the semiconductor in a dilute solution of hydrofluoric acid (600 ccs. of 50% $NH_4F$ and 2,000 ccs. water) for about one second, after which I remove the surface from the etching solution and rinse it with distilled water. The relatively thin oxide layer 26 can be completely removed by this quick etch before the etching acid has time to adversely affect the relatively thick oxide layer 14 or change the boundary configuration of opening 16 which it defines. Although the edge of the oxide boundary may be minutely cut by this quick etch, this does not cause breakdown points in the narrow channel which I form because the mask boundary still has precisely the same configuration.

I control the time of diffusion of the second dopant 28 to form its boundary at a predetermined distance from the boundary of dopant 22 to form a narrow channel 32 of p-type conductivity between the junction 24 established by the boundary of dopant 22 and junction 34 established by the boundary of dopant 28. Because I use the same mask opening, or one having precisely the same boundary configuration, for diffusing both dopants, the second diffusion faithfully follows the plane contour of the first. Any irregularities such as 18 are followed, and channel 32 has a uniform width at any depth of diffusion. Owing to this fact, I can permit the second diffusion to continue until its boundary is a minute distance from the boundary of the preceding diffusion without danger of short circuits because of mask irregularity. It will also be noted that there is no alignment problem since only one mask opening is used.

Although the two dopants 22 and 28 do not usually diffuse at the same rate, the lateral diffusion rate of each is a fraction of its diffusion rate perpendicular to the exposed semiconductor surface. The width of channel 32 is therefore less at the surface of the semiconductor wafer 12 than at any depth, making the most active part of the channel 32 at the surface of the substrate.

As will be apparent to those skilled in the art, additional diffusions through the same opening can be made to form additional narrow channels in the semiconductor wafer, if desired.

FIGURES 6 to 14 show the steps I use in making transistors by my new process. I start with a wafer of semiconductor material 40, and cover one of its surfaces with a passivating oxide coating 42. Into this coating I photoetch an opening 44 exposing an area of the substrate surface through which I diffuse a first dopant 46. For example, wafer 40 may be n-type silicon, and dopant 46 may be a p-type impurity. After the first diffusion I remove any oxide, such as 48, which forms during diffusion of dopant 46. I use a quick etch, preserving the boundary configuration of the oxide coating 42 around opening 44.

Before diffusing the next dopant, I make an opening 52 in the oxide mask 42 adjacent opening 44 exposing another area of the semiconductor surface. As will be pointed out more fully hereinafter I connect an ohmic lead at the semiconductor surface exposed by opening 52.

I diffuse a second dopant 54, which is the same conductivity type as the semiconductor wafer 40, through both the opening 44 and opening 52. In this example, since the first dopant was p-type, dopant 54 is n-type. I control the extent of each diffusion through opening 44 to form a narrow channel 56 of p-type conductivity. The diffusion of n-type impurity increases the conductivity of the wafer 40 under the opening 52 in the region 58. I space opening 52 far enough from opening 44 so that there is no danger of irregularities in the mask openings 44 and 52 causing n-type dopant from opening 52 to diffuse into the p-type channel 56.

I prefer to use a semiconductor wafer 40 with a low impurity level so that the impurity levels at the junction between channel 56 and wafer 40 are low. This results in a high breakdown voltage for the transistor, since breakdown voltage is a function of the junction impurity levels. However, the overall resistance between region 58 and region of dopant 54 is low, since the path length through the high resistivity material 40 is short in the active region of the transistor—at the surface of the wafer 40 where the channel 56 is narrowest.

I deposit a metal film 66 on the oxide covering 42 which overlies the narrow channel 56. Film 66 can be produced by a number of methods known in the art. For example, aluminum or other suitable metal can be deposited by vacuum evaporation through a suitable mask.

After removing any oxide formed during the last diffusion, I attach appropriate leads for the transistor desired. FIGURE 12 shows a metal oxide field effect transistor for which I provide: a source lead 64, which makes ohmic contact to the semiconductor wafer surface in the region surrounded by channel 56; a gate lead 68 connected to the metal film 66; and a drain lead 62 which makes ohmic contact at the wafer surface in the enriched conductivity region 58.

In operation the field effect transistor shown in FIGURE 12 is basically the same as a conventional metal oxide field effect transistor. A positive bias is applied to gate lead 68 which creates electric field perpendicular to the plane of the silicon wafer 40 and draws some of the electrons in the p-type channel 56 toward the surface. Because of the high resistance of the silicon dioxide coating 42, the electrons cannot reach conductive coating 66 and are trapped in concentrations at the interface between the silicon wafer 40 and silicon dioxide mask 42. As the bias increases, more and more electrons are drawn up until they outnumber the holes near the surface and the material behaves as though it were doped n-type at this surface. Thus channel 56 goes through an inversion of conductivity type yielding an n-type path, in this example, from source lead 64 to drain lead 62 which can conduct in either direction. Varying the bias on gate lead varies the current flowing from source to drain.

FIGURES 13 and 14 show the steps in the construction of a bipolar transistor. The steps are basically the same as for the metal oxide field effect transistor shown in FIGURES 6 to 12 except in the bipolar transistor channel 56 is the base and I enlarge a surface area thereof for the base lead contact. As shown in FIGURES 13 and 14, one way to form the required base contact area is to put an acid resist 72 on a small area of the oxide film 48, which is formed during the diffusion of the first dopant 46. This preserves the oxide coating in this area from the quick etch used to clear opening 44, but does not change the configuration of the boundary which forms the remainder of the opening 44. Diffusion of the second dopant 54 forms channel 56 with an enlarged portion suitable for ohmic contact on that portion of its surface covered by oxide 72. After the second diffusion is complete, and before attaching the leads, I remove oxide 72 and any other oxide that forms with the second diffusion.

In a bipolar transistor construction semiconductor wafer 40 is the collector, and I attach a collector lead 82 at the surface of the enriched region 58. Channel 56 is the base to which I attach a base lead 74. The region of the second dopant 54 is the emitter, to which I attach the emitter lead 88.

In bipolar transistor operation the metal film 66 can advantageously be formed and reverse biased with respect to the base 56 to prevent the development of surface breakdown channels. Additionally, since the base 56 is narrowest at the surface of the wafer 40, as the reverse bias of the film 66 with respect to base 56 is increased the active region of the base is driven deeper into the crystal, with a resultant increase in base width, and decrease in gain. Since the gain in this type of transistor is dependent upon its base width, controlling the depth in the base material at which activity is concentrated controls its gain.

Thus I have accomplished the objects of my invention. I provide a method of reliably making narrow semiconductor channels in a semiconductor substrate. The channels I form are narrowest at the surface of the substrate. With my novel method the masking is not critical. My novel method can form narrow semiconductor channels in semiconductor substrates that have low resistivity. I have provided a high-frequency, high-gain, metal-oxide field effect transistor with a high avalanche breakdown voltage, low impedance, and low leakage current. I have provided a variable gain bipolar transistor. My construction provides planar transistors with a high avalanche breakdown voltage, and a low overall impedance.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is therefore to be understood that my invention is not to be limited to the specific details shown and described.

Having thus described my invention, what I claim is:

1. A semiconductor device comprising a body of semiconductor material of one conductivity type providing a surface, a first diffusion of material of the opposite conductivity type extending into said body over an area of said surface, a second diffusion of material of said one conductivity type extending into said body over an area of said surface within said first area, said diffusions forming a continuous thin shell-like region of material of the opposite conductivity type in said body, said thin shell-like region being of generally uniform thickness over the major portion of its extent, the material of said diffusions and of said body forming two semiconductor junctions extending to said surface, said junctions at said surface being sufficiently close together as to provide transistor action at said surface, an insulating layer on said surface adjacent said junctions, a conducting coating on said insulating layer, and respective ohmic contacts to said surface in the area of said second diffusion and to said surface outside the area of said first diffusion.

2. A semiconductor device comprising a body of semiconductor material of one conductivity type providing a surface, a first diffusion of material of the opposite conductivity type extending into said body over an area of said surface, a second diffusion of material of said one conductivity type extending into said body over an area of said of said surface within said first area, said diffusions forming a continuous thin shell-like region of material of the opposite conductivity type in said body, said thin shell-like region being of generally uniform thickness over the major portion of its extent while providing a relatively thicker portion over a limited area at said surface, the material of said diffusions and of said body forming two semiconductor junctions extending to said surface, said junctions as said surface outside said limited area being sufficiently close together as to provide transistor action at said surface, an insulating layer on said surface over said shell-like region outside said limited area, a conductive coating on said insulating layer, and respective ohmic contacts to said surface in said limited area and in the area of said second diffusion and outside the area of said first diffusion.

References Cited

UNITED STATES PATENTS

| | | | |
|---|---|---|---|
| 3,204,160 | 8/1965 | Chih-Tang Sah | 317—235 |
| 3,243,669 | 3/1966 | Chih-Tang Sah | 317—234 |
| 3,345,216 | 10/1967 | Rogers | 148—1.5 |

JOHN W. HUCKERT, Primary Examiner

R. SANDLER, Assistant Examiner

U.S. Cl. X.R.

29—571